INVENTOR.
JAMES P. BEESLEY
BY John A. Harvey
ATTORNEY

Nov. 13, 1962 J. P. BEESLEY 3,063,629

BINARY COUNTER

Filed Sept. 10, 1957

2 Sheets-Sheet 2

INVENTOR.
JAMES P. BEESLEY

BY John A. Harvey

ATTORNEY 3,063,629
BINARY COUNTER
James P. Beesley, Poughkeepsie, N.Y., assignor to International Business Machines Corporation, New York, N.Y., a corporation of New York
Filed Sept. 10, 1957, Ser. No. 683,091
13 Claims. (Cl. 235—92)

The present invention relates to electrical counters and, more particularly, to such counters for effecting a totalizing count in binary form of a plurality of successively presented unit digits.

It is often desirable to provide a counter for effecting a count of successively presented unit digits, electrical pulses, and the like repetitive information. Such counters have heretofore been proposed in many forms involving both mechanical and electrical constructions. Many applications, especially those concerned with the counting of information presented at high speed, make the use of electrical counters desirable or even necessary.

One general form of electrical counter heretofore proposed involves a simple arrangement of unit counting stages controlled successively in turn by successively presented information bits to be counted. Upon completion of the maximum count of these counting stages, the last stage in effecting its count provides a "carry out" indication. The latter may be applied to a similar arrangement of tens counting stages, where the total count expected is known to exceed the number of units counting stages provided. The carry out of the tens counting stages may similarly be applied to a hundreds arrangement of counting stages, thus to provide counting by decade steps. These arrangements become expensive and relatively complex where a large total count is required, for example requiring 61 counting stages in seven associated counter-stage arrangements to effect a total count of one million.

Substantial simplification of electrical counters of the type last described may be effected by arranging them to provide a binary form of count. This is usually accomplished by the use of a tandem arrangement of bistable multivibrators each having input circuits operated in binary fashion and with the output circuit of one multivibrator coupled to the input circuits of a succeeding multivibrator. These binary counters have conventionally used vacuum tubes and associated components in each multivibrator stage, thus also tending to be more complicated and expensive than is desirable for many applications. Consistent reliability over long periods of operation also dictates the use of premium tubes and components. While enhancing the counter reliability and reducing its maintenance costs, this further increases the initial cost of the counter.

It is an object of the present invention to provide a new and improved electrical counter of the binary form and one which avoids one or more of the disadvantages and limitations of prior such counters.

It is a further object of the invention to provide a novel binary counter which facilitates the use of magnetic core storage devices, and thus is one which possesses many of the very desirable virtues and advantages characteristic of such devices.

It is an additional object of the invention to provide an improved binary counter of substantially simplified circuit arrangement and compact construction, and one characterized by exceptionally high stability and reliability in operation yet of relatively low initial cost and substantially reduced maintenance cost.

Other objects and advantages of the invention will appear as the detailed description proceeds in the light of the drawings forming a part of this application in which:

FIG. 1 is a schematic circuit diagram representing a binary counter embodying the present invention;

FIG. 2 graphically represents certain pulse-voltage relationships occurring in the operation of the counter of FIG. 1 and is used as an aid in explaining its operation;

Figure 1:
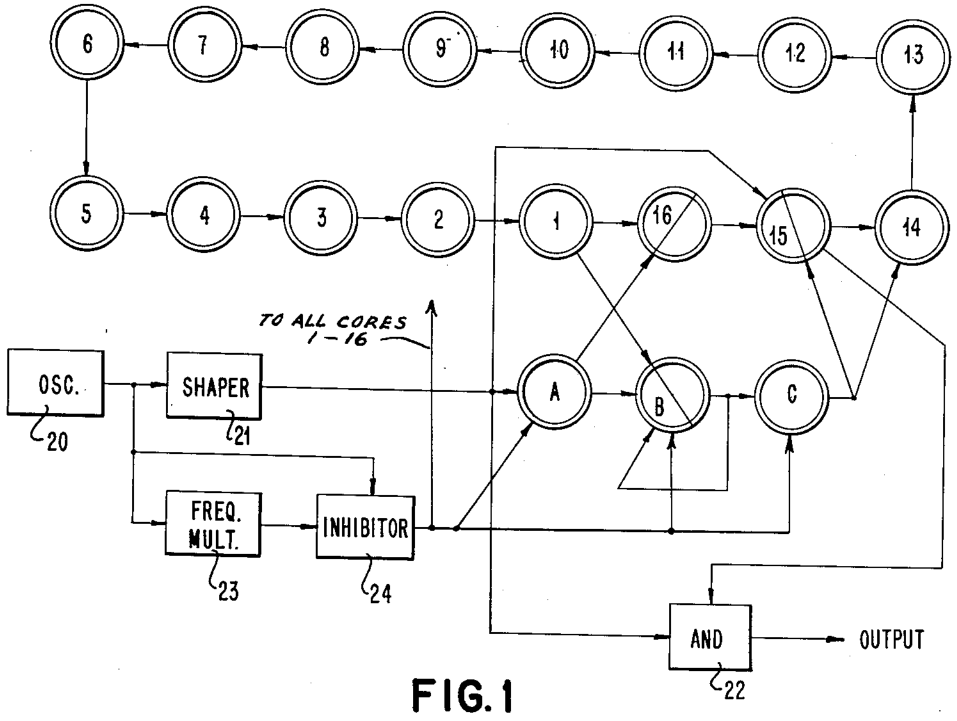

The binary counter of FIG. 1 includes a plurality of magnetic storage cores 1–16 arranged in ascending order of digit storage positions and having the input circuit of one core coupled to the output circuit of a preceding core, the input circuit of the highest-order core 16 being coupled to the output circuit of the lowest-order core 1 to provide a closed ring of core storage stages. These cores are shown merely in schematic form, but it will be understood that each is of conventional construction and includes a magnetic core and associated windings presently to be enumerated. The core provides a closed magnetic path and is formed of a material exhibiting high magnetic retentivity, preferably a material of the type characterized as having an essentially rectangular hysteresis characteristic with a low value of coercivity. Conventional input and output winding are provided on the cores and are intercoupled in a manner presently to be considered in greater detail. Certain of the cores have inhibit windings on them, and thus embody an inhibit winding construction more fully described and claimed in the copending application of R. C. Lamy, Serial No. 530,522, filed August 24, 1955, entitled Ternary Magnetic Storage Device, and assigned to the same assignee as the present application.

The input winding of a core produces a magnetic flux which drives the core to magnetic saturation with one polarity, hereinafter referred to for convenience as "positive" saturation or as causing the core to store a "plus one." An advance winding is provided on each core and develops a magentic field in a direction to drive the core to "negative" saturation, hereinafter referred to as causing the core to store a "minus one." The output winding of the core develops output energy whenever the core changes from positive saturation to negative saturation or vice versa, but the inter-core coupling networks have a unidirectional current conductive characteristic permitting utilization only of the former change. Positive to negative saturation change is thus effected by each advance pulse in any core previously storing a plus one. The inter-core coupling networks provide a small time delay so that this saturation change takes place before the output pulse of a preceding core can be translated through the network and applied as an input pulse to the input winding of a succeeding core. This input pulse will now drive the succeeding core to positive saturation unless this core is provided with an inhibit winding and the latter is energized by an inhibit current pulse to develop a magnetic field which neutralizes in large part that produced by the input pulse.

The counter also includes three tandem coupled magnetic storage cores identified as A, B and C of which core A provides temporary storage of each of successively presented unit digits (shown in the form of a repetitive electrical pulses) to be counted, and cores B and C provide a control function presently to be described. As indicated in FIG. 1, core A is provided with an output circuit which is coupled both to an inhibit winding of the highest-order storage core 16 (as indicated by the slant line drawn through this core) and is also coupled to the input winding of core B. The output winding of the lowest-order storage core 1 is coupled to the input winding of the highest-order core 16 as earlier mentioned and also to an inhibit winding of the core B. The output winding of core B is coupled in regenerative manner to a second input winding of this core and is also coupled to the input winding of core C. The output winding of core C is coupled both to an inhibit winding of the next-to-the-highest-order storage core 15 and is also coupled to an input winding of the second-from-the-highest-order storage core 14. Thus as has just been indicated and as presently will be explained more fully, the cores 1–16 are arranged in a closed ring and an initial input pulse temporarily stored in core A is transferred by stepping pulses through the highest-order storage core 16 to the lowest order storage core 1. In each successive such transfer operation, this same transfer continues but is so modified as in effect to cause a column shift up of the lowest-order consecutively stored minus ones. Considered with respect to the initiation of the transfer operation, the interconnections and intercontrols of cores 1 and B and of core C and each of cores 14 and 15 in effect cause a column shift up each time a minus one is found to be stored or to become consecutively stored in the lowest-order core 1.

By way of illustration of a particular application wherein a binary counter embodying the invention has utility, FIG. 1 shows the counter arranged to count the successive cycles of oscillation of an oscillator 20. The oscillations generated by the latter are translated through a shaper 21 to convert each half cycle of one polarity of the generated oscillations to a sharp pulse which in turn is concurrently applied to an input winding of the core A and to the input winding of one of the counter cores 1–15 selected to establish the maximum count capacity, such for example as the core 15, and is also applied to an AND gate 22. The output circuit of oscillator 20 is also coupled to the input circuit of a frequency multiplier 23, operating to produce advance pulses of relatively short pulse duration, and to an input circuit of an inhibitor 24 which receives the output pulses of the frequency multiplier 23.

Figure 2:
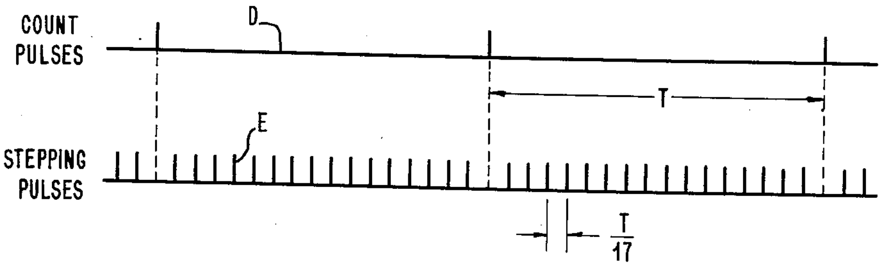

As represented graphically in FIG. 2, the pulses generated in the output circuit of the shaper 21 and comprising the pulses to be counted are represented by curve D. The pulses generated in the output circuit of the frequency multiplier 23 are represented by curve E. For the counter shown in FIG. 1 having 16 counter storage cores, the frequency multiplier 23 generates 17 output pulses for each pulse developed in the output circuit of the shaper 21. Each 17th such generated pulse of the frequency multiplier 23 is inhibited by the inhibitor 24, under control of the oscillations generated by the oscillator 20, as represented by the broken line pulses of curve E. The pulses translated by the inhibitor 24 comprise advance or stepping pulses which are concurrently applied to the advance windings of all of the counter storage cores 1–16 and the cores A, B and C.

The output winding of the next-to-the-highest-order storage core 15 of the counter is coupled to the input circuit of the succeeding storage core 14, as earlier explained, and is also coupled to a second input circuit of the AND gate 22 so that the latter generates an output pulse whenever the core 15 develops an output pulse coincidentally with the application to this gate of an input pulse to be counted. As will presently be explained more fully, thus occurs only at the time when the counter has completed its maximum count.

In considering the operation of the counter just described, it may be stated at the outset that the counter performs what may be considered a totalizing binary count up of minus ones or a binary count down of plus ones. The pulses are applied from the shaper 21 to the core A for temporary storage therein as plus-one stored pulses. Assume that just previous to the time when the first such pulse is applied to core A all of the cores A, B and C have stored a minus one and all of the cores 1–16 have stored a plus one. These assumed conditions are the "reset" or initial conditions under which the counter initiates a counting operation. Now when the first advance pulse is applied to all of the cores from the inhibitor unit 24 after a plus-one pulse has been temporarily stored in core A, the plus one stored in the core A inhibits transfer to the core 16 of the plus one previously stored in the core 1, and the plus one previously stored in the core 1 inhibits transfer to the core B of the plus one which was stored in the core A. Accordingly the application of this first advance pulse has the result that the cores A, B and C now store a minus one, the core 16 now stores a minus one, and the cores 1–15 store a plus one. Successive advance pulses transfer the minus one stored in the core 16 to storage in the core 1. This completes the first count period, and it will be seen that a minus one has been counted up and the plus ones have been counted down or reduced in total value by one unit digit.

Now when the second pulse to be counted is temporarily stored in the core A and subsequently inhibits the core 16 as before during the first stepping pulse of this second count period, the inhibit action has no effect since the core 1 initially stored a minus one from the previous count period. However, the storing of a minus one in the core 1 now does not inhibit core B so that the plus one previously stored in the core A is transferred to storage in the core B. This first stepping pulse also transfers the plus one pulse stored in each of cores 2–16 to the succeeding lower-order core and in particular transfers a plus one from the storage core 2 to the storage core 1. At the second stepping pulse, this plus one stored in the core 1 now inhibits regeneration of the plus one in core B but the stepping pulse transfers the plus one in the core B to storage in the core C and transfers the plus one in core 1 to storage in core 16. Thus the application of the second stepping pulse has the result that a minus one is now stored in the cores A, B and 15. The third stepping pulse of this second count period now causes core C to inhibit the transfer of the plus one in core 16 to core 15, thereby to leave the latter storing a minus one, and the plus one in core C is transferred directly to storage in the core 14. Thus at the end of the third stepping pulse, the cores A, B and C each store a minus one, the core 15 stores a minus one, and the cores 1–14 and 16 each store a plus one. The remaining 13 stepping pulses in this second count period are effective to transfer the minus one stored in the core 15 to storage in the next-to-the-lowest-order storage core 2, thereby to complete the count period by effecting a binary-2 count up of minus ones and a binary-2 count down of plus ones.

In the third count period, the plus one stored in core 1 at the outset of the period inhibits core B so that the operation occurring during this period is the same as that described for the first count period in that the minus one stored in core 16 after the end of the first stepping pulse of the period is transferred to storage in core 1 at the end of the period and the minus one which was stored in core 2 at the initiation of the period is returned to core 2 at the end of the period. Accordingly at the end of the third counting period the cores A, B and C each store a minus one, the cores 1 and 2 also each store minus ones, and the cores 3–16 store plus ones. Thus a binary-3 value of minus ones is stored in the counter at the end of this period, and the stored plus ones have been reduced by a binary-3 value.

The first stepping pulse of the fourth counting period effects transfer of a plus one from core A to core B which is not inhibited at this time due to the initial storage of a minus one in core 1. This first stepping pulse also effectively transfers the minus one stored in core 2 to storage in core 1. The second stepping pulse transfers the plus one stored in core B to core C, and the plus one is regenerated in core B due to the minus one stored at this time in core 1. This leaves cores A, 15 and 16 storing minus ones and leaves cores B and C and cores 1–14 storing plus ones. The third stepping pulse transfers the plus one stored in core C to storage in core 14 (core 15 stored a minus one at this time) and inhibits the core 15 but without effect since the core 16 previously stored a minus one. This stepping pulse also transfers the plus one stored in core B to storage in core C, but the plus one now stored in core 1 prevents further regeneration of the core B so that the latter stores a minus one at the end of this stepping pulse. The fourth stepping pulse causes the output of core C again to inhibit core 15 to prevent the plus one stored in core 16 from transferring to core 15, and this again leaves the latter storing a minus one. At the same time, the plus one stored in core C is transferred to storage in core 14. Accordingly at the end of the fourth stepping pulse the cores A, B and C each store a minus one, the core 15 stores a minus one, and the cores 1–14 and 16 store plus ones. The ensuing 12 stepping pulses in this counting period now transfer the minus one from storage in core 15 to storage in core 3, which constitutes a binary-4 count up of minus ones and a count down of plus ones by a binary-4 value.

It will be apparent from the foregoing description that the cores 1 and 3 store minus ones (binary-5) at the end of the fifth count period; that the cores 2 and 3 store minus ones (binary-6) at the end of the sixth counting period; that the cores 1, 2 and 3 store minus ones (binary-7) at the end of the seventh counting period; and that during the eighth counting period the plus one of core A is transferred to and regenerated twice in the core B (due to initial storage of minus ones in cores 1, 2 and 3) so that a minus one is stored in core 4 (binary-8) at the end of this period. Thus it will be apparent that the counter effects a binary count up of minus ones and a binary count down of plus ones for each input pulse applied to the core A from the shaper 21.

It can be shown that while the core 15 develops and applies to the AND gate 22 numerous output pulses during the operation of the counter, only one such output pulse is applied to the AND gate 22 in coincidence with an input pulse applied to the core A and this occurs at the time the counter has counted to its maximum capacity represented by the position of core 15 in the ring of cores. This fact will be more apparent if it be assumed that the input pulses to be counted are applied to core 2 rather than core 15 and that the output of core 2 is applied to the AND gate 22. Under this assumption, core 2 establishes the maximum count capacity of the counter. It stores a plus one after the first input pulse is applied to core A and counted, but stores a minus one after the second input pulse is counted so that a third pulse applied to both cores A and 2 changes the storage in core 2 from a minus one to a plus one and thereupon develops an output pulse which is applied to AND gate 22 coincidentally with the third pulse. It will be noted that when this occurs, the third pulse is left in temporary storage in core A but all of the ring cores 1–16 are left storing a plus one which as noted above is the reset condition at which the counter initiates its counting operation. Since this counter reset state occurs after a count of only two input pulses, the counter is seen to have a maximum capacity of 2 counts. If it had been assumed that the input pulses were applied to core 3 and that the output of the latter was applied to the AND gate 22, it will be apparent that an output pulse would have been applied from core 3 to the AND gate 22 and the counter reset upon the occurrence of the fourth input pulse thus to provide a maximum capacity of 4 counts.

It will be clear from the foregoing description that when concurrent pulses are applied to the AND gate 22 from the shaper 21 and from the output of a selected one of the cores 1–15 (such as the core 15), the AND gate 22 develops an output pulse indicative of the fact that the counter has counted to maximum capacity. This output pulse of the AND gate 22 is equivalent to the usual "carry out" provided by prior counters as indicative of their attaining their maximum count.

Figure 3:
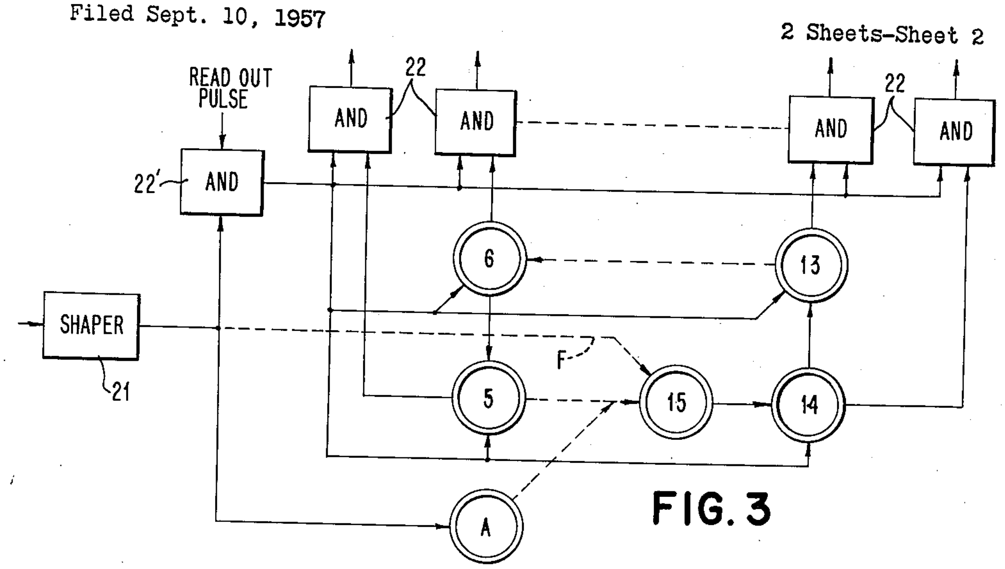
FIG. 3 represents a binary counter embodying a modified form of the invention.

If AND gates similar to the AND gate 22 are provided for each of the cores 1–15 and if an input pulse is applied to all of these cores at a desired read out time through a read-out control AND gate 22′ as indicated in FIG. 3, the read out in this instance will be comprised by the binary number stored at that time by the the counter and with the binary bits of the stored number read out in parallel form. This character of read out may also be effected without resetting the counter, by the use of non-destructive read-out windings on the cores 1–15 and by energizing such windings by the output pulse of the AND gate 22′. Such non-destructive read-out windings may be arranged as disclosed in copending United States patent application Serial No. 383,568, filed October 1, 1953, on behalf of Edgar A. Brown, or Serial No. 530,523, filed August 25, 1955, on behalf of Edgar A. Brown et al., both of which applications are assigned to the same assignee as the present application. In this instance the highest-order core which establishes the maximum count of the counter may also receive the input pulse of the shaper 21 (as indicated by the broken line F (to effect counter resetting as in the FIG. 1 arrangement.

Figure 4:
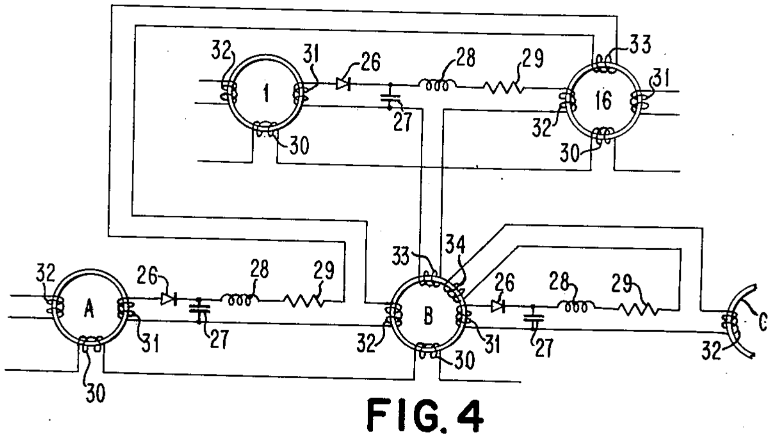
FIG. 4 is a circuit diagram showing in greater detail the coupling arrangements employed between several counting and control stages of the counter.

FIG. 4 is a circuit diagram representative of the networks intercoupling the cores of the counter, here shown by way of specific illustration as those for the cores A, B, 1 and 16. Also shown is the nature of the inhibit winding circuit between cores A and 16 and between cores 1 and B as well as the nature of the regenerative winding circuit used for core B. The coupling networks are conventional and each employs a series diode rectifier 26, a shunt condenser 27, a series inductor 28 and a series resistor 29. This form of network provides a small delay interval between the time when a stepping pulse applied to the stepping winding 30 of a core produces an output pulse in the output winding 31 of the core and the time when this output pulse is translated through the network to the input winding 32 of the succeeding core. It will be noted that the output of the coupling network of the core A includes in series arrangement the inhibit winding 33 of the core 16 and the input winding 32 of the core B, and that the output of the coupling network associated with the core 1 similarly includes in series the inhibit winding 33 of the core B and the input winding 32 of the core 16. A stepping pulse applied to stepping winding 30 of the cores initiates transfer of pulse energy from the output winding 31 of each core to the associated coupling network, and after a delay interval provided by the network the pulse energy is applied to the input winding 32 of the subsequent core. Since all of the coupling networks provide an equal delay interval, it will be seen that inhibit winding 33 associated with a given core is energized at the same time that the input winding 32 of this core is energized so that the inhibit winding when energized is effective to prevent storage of a plus one in that core. This delay interval provided by the coupling networks has importance also in connection with the regeneration of plus one storage in the core B, where the output of its associated coupling network includes in series a second input winding 34 on the core B and the input winding 32 of core C so that plus one pulse energy transfer out of core B to its associated coupling network is returned by the winding 34 back to storage in this core unless the inhibit winding 33 of the core is concurrently energized by plus one energy transferred out of the core 1.

Figure 5:
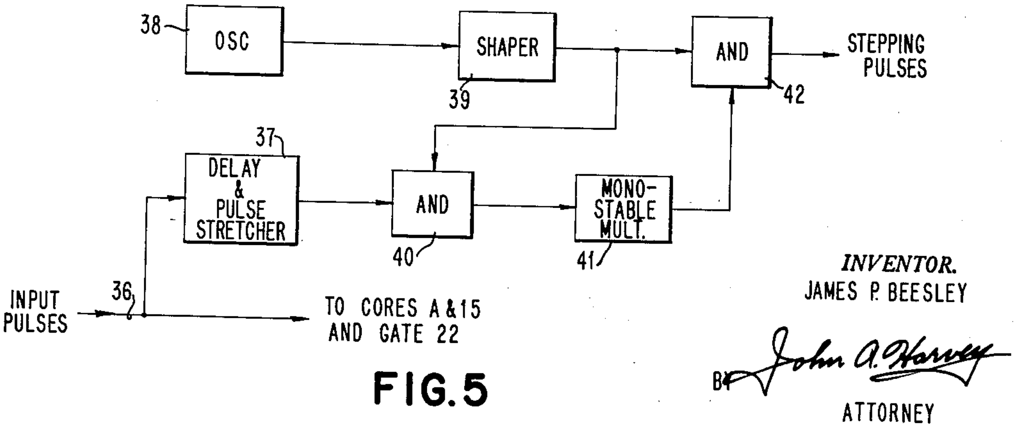
FIG. 5 represents schematically the arrangement of a modified form of generator for generating shift pulses employed in the operation of a counter embodying the invention.

While the FIG. 1 arrangement has been shown by way of example as one utilized for counting pulses generated by the oscillator 20 and thus presented at constant periodicity, the counter has equal utility for counting electrical pulses occurring at random times of presentation to the counter. FIG. 5 represents schematically a stepping pulse generator arrangement for use with the counter by which to effect counting of randomly presented pulses. The random pulses are applied through an input circuit 36 to the input windings of cores A and 15 and to the AND gate 22 as shown in FIG. 1 and are also applied to a delay and pulse stretcher unit 37 which delays each input pulse by a small amount sufficient to enable storage to be completed in the storage cores before generation of the first stepping pulse. Unit 37 is of conventional construction and stretches each input pulse to provide in the output circuit of this unit an output pulse which is not only delayed as mentioned but also has a pulse duration slightly longer than the interval between the stepping pulses. The latter are generated by an oscillator 38 and shaper 39, which is responsive to each half cycle of given polarity of the oscillator 38 to produce a stepping pulse of suitable pulse length. The stepping pulses generated in the output circuit of the shaper 39 are applied to an AND gate 40 which is effective to translate one such stepping pulse whenever this gate is opened by an input pulse translated through the unit 37. Each pulse so translated by the AND gate 40 turns on a monostable multivibrator 41 which thereupon generates in its output circuit and applies to an AND gate 42 a potential pulse of sufficient duration to cause the latter gate to translate a number of stepping pulses from the shaper 39 corresponding to the number of storage cores employed in the counter. Thus a group of stepping pulses is applied to the stepping windings of the cores of the counter following each input pulse appearing in the input circuit 36, and the resulting operation of the counter is otherwise in all respects like that previously described in connection with FIG. 1.

While specific forms of the invention have been described for purposes of illustration, it is contemplated that numerous changes may be made without departing from the spirit of the invention.

What is claimed is:

1. A binary counter comprising, a plurality of storage stages arranged to store in order the individual digits of a binary-form number, the highest-order and lowest-order ones of said stages being coupled to provide a closed ring thereof, translating means for translating into positional storage in said stages plural successive input digit units to be counted, means responsive to a preselected stored digit-unit quantity in the low-order one of said storage stages for controlling said translating means during translation of each digit unit to effect controlled positional storage in said stages and provide a binary-form count of said digit units to be counted, and means for concurrently supplying said input digit units to a preselected storage stage to derive a digit-unit output therefrom coincident in time with the occurrence of an input digit unit whenever said counter has counted to a preselected binary number corresponding to the order of said preselected stage.

2. A binary counter comprising, a plurality of storage stages arranged to store in order the individual digits of a binary-form number, the highest-order and lowest-order ones of said stages being coupled to provide a closed ring thereof, translating means for translating within a translation interval and through said highest-order stage to storage in a lower-order stage each of plural successive input digit units to be counted, means responsive to a preselected initial and each similar successively stored digit-unit quantity in said lowest-order storage stage beginning with and continuing through each said translation interval for controlling said translating means during translation of each digit unit to effect controlled positional storage in said stages and provide a binary-form count of said digit units to be counted, and means for concurrently supplying said input digit units to the next-to-the-highest-order storage stage to derive a digit-unit output therefrom coincident in time with the occurrence of an input digit unit whenever said counter has counted to its maximum binary count capacity.

3. A binary counter comprising, a plurality of magnetic storage cores arranged to store in order the individual digits of a binary-form number, the highest-order and lowest-order ones of said cores being coupled to provide a closed ring thereof, translating means responsive to each of successive input digit units for translating each said digit unit into positional storage in the highest-order one of said cores and for effecting thereafter under initiation by said each input digit unit an automatic shift of all information stored in said cores by a number of successive shift steps corresponding to one less than the number of said cores, and means responsive to a preselected stored digit-unit quantity in the lowest-order one of said storage cores for controlling said translating means during said automatic shifting of stored information to provide a binary-form count of said input digit units to be counted.

4. A binary counter comprising, a plurality of magnetic storage cores arranged to store in order the individual digits of a binary-form number, the highest-order and lowest-order ones of said cores being coupled to provide a closed ring thereof, translating means for temporarily storing each of successive input digit units to be counted, and means responsive to each said input digit unit for controlling said translating means to effect translation of each said digit unit into positional storage in the highest-order one of said cores accompanied by an automatic shift of all information stored in said cores by a number of successive shift steps corresponding to the number of said cores, and means responsive to a preselected stored digit-unit quantity in the lowest-order one of said storage cores for controlling said translating means during said automatic shifting of stored information to provide a binary-form count of said input digit units to be counted.

5. A binary counter comprising, a plurality of magnetic storage cores arranged to store in order the individual digits of a binary-form number, the highest-order and lowest-order ones of said cores being coupled to provide a closed ring thereof, translating means for temporarily storing each of successive input digit units to be counted, delay means, and means responsive to each input digit unit translated through said delay means for controlling said translating means to effect translation of each said digit unit into positional storage in the highest-order one of said cores accompanied by an automatic shift of all information stored in said cores by a number of successive shift steps corresponding to the number of said cores, and means responsive to a preselected stored digit-unit quantity in the lowest-order one of said storage cores for controlling said translating means during said automatic shifting of stored information to provide a binary-form count of said input digit units to be counted.

6. A binary counter comprising, a plurality of magnetic storage cores arranged to store in order the individual digits of a binary-form number, the highest-order and lowest-order ones of said cores being coupled to provide a closed ring thereof, translating means for temporarily storing each of successive input digit units to be counted, a source of shift-control pulses, delay means for translating with a preselected time delay each said input digit unit, timing means responsive to each said delayed input digit unit for selecting and translating a number of shift-control pulses corresponding to the number of said cores, means for supplying said translated shift-control pulses to said translating means and each of said storage cores to shift each said input digit unit temporarily stored by said translating means into positional storage in the highest-order one of said cores accompanied by an automatic shift of all information stored in said cores by a number of successive shift steps corresponding to the number of said cores, and means responsive to a preselected stored digit-unit quantity in the lowest-order one of said storage cores for controlling said translating means during said automatic shifting of stored information to provide a binary-form count of said input digit units to be counted.

7. A binary counter comprising, a plurality of magnetic storage cores arranged to store in order the individual digits of a binary-form number, the highest-order and lowest-order ones of said cores being coupled to provide a closed ring thereof, translating means for temporarily storing each of successive input digit units to be counted, a source of shift-control pulses, delay means for translating with one shift-pulse delay each said input digit unit a monostable multivibrator having an operative state initiated by each said delayed digit unit and an operative period corresponding to the same number of shift-pulse intervals as the number of said cores, means responsive jointly to said shift-control pulses and said operative state of said multivibrator for supplying shift-control pulses to said translating means and said cores to effect translation of each said input digit unit into positional storage in the highest-order one of said cores accompanied by an automatic shift of all information stored in said cores by a number of successive shift steps corresponding to the number of said cores, and means responsive to a preselected stored digit-unit quantity in the lowest-order one of said storage cores for controlling said translating means during said automatic shifting of stored information to provide a binary-form count of said input digit units to be counted.

8. A binary counter comprising, a plurality of magnetic storage cores arranged to store in order the individual digits of a binary-form number, the highest-order and lowest-order ones of said cores being coupled to provide a closed ring thereof, translating means for translating each of successive input digit units into binary-count positional storage in said cores, and means including coincidence means responsive to said input digit units for utilizing said input digit units to effect a preselected type of binary digit read out from the counter indicative of the binary value of the number stored in a preselected group of said cores.

9. A binary counter comprising, a plurality of magnetic storage cores arranged to store in order the individual digits of a binary-form number, the highest-order and lowest-order ones of said cores being coupled to provide a closed ring thereof, translating means for translating each of successive input digit units into binary-count positional storage in said cores, and means including coincidence means responsive to said input digit units for utilizing said input digit units to effect read-out magnetic energization of at least one of said storage cores and provide a preselected type of binary digit read out indicative of the binary value of the number stored in a preselected group of said cores.

10. A binary counter comprising, a plurality of magnetic storage cores arranged to store in order the individual digits of a binary-form number, the highest-order and lowest-order ones of said cores being coupled to provide a closed ring thereof, translating means for translating each of successive input digit units into binary-count positional storage in said cores, and means including coincidence means responsive to said input digit units for utilizing said input digit units to effect read-out magnetic energization of the highest-order one of said storage cores and provide a binary digit read out indicative of the attainment by said counter of its maximum binary count capacity.

11. A binary counter comprising, a plurality of magnetic storage cores arranged to store in order the individual digits of a binary-form number, the highest-order and lowest-order ones of said cores being coupled to provide a closed ring thereof, translating means for translating each of successive input digit units into binary-count positional storage in said cores, a preselected one of said storage cores having an output winding and a read-out winding energized by said input digit units, and responsive to concurrent energization by said input digit units and said output winding to provide a binary digit read out indicative of the attainment by said counter of its maximum binary count capacity in all storage cores of lower order than said preselected storage core.

12. A binary counter comprising, a plurality of magnetic storage cores arranged to store in order the individual digits of a binary-form number, the highest-order and lowest-order ones of said cores being coupled to provide a closed ring thereof, translating means for translating each of successive input digit units into positional storage in the highest-order one of said cores, and means responsive to translation of each said input digit unit for utilizing said input digit units to effect a preselected type of binary digit read out indicative of the binary value of the number stored in a preselected group of said cores.

13. A binary counter comprising, a plurality of magnetic storage cores arranged to store in order the individual digits of a binary-form number, and each including an output winding and a read-out control winding, the highest-order and lowest-order ones of said cores being coupled to provide a closed ring thereof, translating means for translating each of successive input digit units into binary-count positional storage in said cores, read out control means for translating a preselected one of said input digit units concurrently to all of said read-out control windings, and coincidence means responsive to translation of said preselected input digit unit for translating to plural output circuits of said counter and in parallel presentation the outputs of said output windings as representative of the value in binary notation of the number stored in said storage cores.

References Cited in the file of this patent

UNITED STATES PATENTS

| | | |
|---|---|---|
| 2,710,952 | Steagall | June 14, 1955 |
| 2,735,021 | Nillsen | Feb. 14, 1956 |
| 2,794,130 | Newhouse et al. | May 28, 1957 |
| 2,821,638 | Fitzgerald | Jan. 28, 1958 |
| 2,831,150 | Wright et al. | Apr. 15, 1958 |
| 2,852,699 | Ruhman | Sept. 16, 1958 |
| 2,900,626 | Newhouse | Aug. 18, 1959 |

OTHER REFERENCES

"Logical and Control Functions Performed With Magnetic Cores" by S. Guterman et al. from "Proc. of the I.R.E.," pp. 291–298, March 1955.